(12) United States Patent
Aebischer

(10) Patent No.: US 12,230,599 B2
(45) Date of Patent: Feb. 18, 2025

(54) METHOD FOR ACTUATING A BONDING HEAD

(71) Applicant: Besi Switzerland AG, Steinhausen (CH)

(72) Inventor: Markus Aebischer, Steinhausen (CH)

(73) Assignee: Besi Switzerland AG, Steinhausen (CH)

( * ) Notice: Subject to any disclaimer, the term of this patent is extended or adjusted under 35 U.S.C. 154(b) by 893 days.

(21) Appl. No.: 17/252,756

(22) PCT Filed: Jun. 23, 2019

(86) PCT No.: PCT/IB2019/055284
§ 371 (c)(1),
(2) Date: Dec. 16, 2020

(87) PCT Pub. No.: WO2019/244136
PCT Pub. Date: Dec. 26, 2019

(65) Prior Publication Data
US 2021/0272925 A1     Sep. 2, 2021

(30) Foreign Application Priority Data

Jun. 23, 2018  (DE) .......................... 102018115144.6

(51) Int. Cl.
*H01L 23/00*       (2006.01)
*H01L 21/677*      (2006.01)

(52) U.S. Cl.
CPC ........ *H01L 24/75* (2013.01); *H01L 21/67721* (2013.01); *H01L 2224/75702* (2013.01);
(Continued)

(58) Field of Classification Search
CPC ............... H01L 24/75; H01L 21/67721; H01L 2224/75702; H01L 2224/75823;
(Continued)

(56) References Cited

U.S. PATENT DOCUMENTS 8,387,851 B1      3/2013  Yung
2006/0076388 A1*  4/2006  Sato ....................... B23K 1/018
                                                    228/102

(Continued)

FOREIGN PATENT DOCUMENTS

JP      H10209223 A     8/1998
JP      2000101294 A    4/2000
(Continued)

*Primary Examiner* — Jeffrey T Carley
*Assistant Examiner* — Jose K Abraham
(74) *Attorney, Agent, or Firm* — HULTQUIST, PLLC; Steven J. Hultquist

(57) ABSTRACT

An apparatus and method for mounting devices on a substrate. Processing is often interrupted during operation because the components are not provided for assembly parallel to the substrate. Inclination control solutions increase the cost, weight and complexity of the bonding head. By tilting the contact surface using existing drives and/or actuators, simplified tilt correction is made possible, providing high throughput and high reliability. The tilt correction mechanism consists of one or more engagement members, one or more adjustment members and one or more tilt position blocks. In some cases, passive elements and mechanisms may be used.

7 Claims, 5 Drawing Sheets

(52) U.S. Cl.
CPC ............. *H01L 2224/75823* (2013.01); *H01L 2224/75824* (2013.01); *H01L 2224/75843* (2013.01); *H01L 2224/75901* (2013.01)

(58) Field of Classification Search
CPC . H01L 2224/75824; H01L 2224/75843; H01L 2224/75901; H01L 2224/75841; H01L 21/6838; H01L 24/80
See application file for complete search history.

(56) References Cited

U.S. PATENT DOCUMENTS

| | | | | |
|---|---|---|---|---|
| 2009/0001133 | A1* | 1/2009 | Kuramochi | H01L 24/75 228/103 |
| 2009/0175705 | A1* | 7/2009 | Nakao | H01L 21/68707 269/21 |
| 2014/0311652 | A1* | 10/2014 | Kostner | H01L 24/75 156/60 |
| 2016/0043053 | A1* | 2/2016 | Seyama | B23K 3/00 228/265 |
| 2016/0086830 | A1* | 3/2016 | Cheung | H01L 24/743 156/578 |
| 2017/0156244 | A1 | 6/2017 | Sato | |
| 2020/0006099 | A1* | 1/2020 | Yamauchi | B29C 35/0805 |

FOREIGN PATENT DOCUMENTS

| | | |
|---|---|---|
| JP | 200340585 A | 12/2000 |
| KR | 20100069973 A | 6/2010 |
| WO | 9814041 A1 | 4/1998 |

* cited by examiner

METHOD FOR ACTUATING A BONDING HEAD

CROSS REFERENCE TO RELATED APPLICATIONS

This application is the U.S. national stage of International Application No. PCT/IB2019/055284, filed on 2019 Jun. 23. The international application claims the priority of DE 102018115144.6 filed on 2018 Jun. 23; all applications are incorporated by reference herein in their entirety.

BACKGROUND

The present invention concerns a method of mounting devices on a substrate provided at a substrate position and a device for mounting devices on a substrate provided at a substrate position.

State-of-the-art methods and devices for mounting components on a substrate are known in a sufficiently wide and high variety to enable or simplify the mounting of components for a wide variety of applications.

The term "device" used in patent claims refers to electronic and/or optical devices, in particular semiconductor chips (also called dies) on a substrate.

The mounting of components in the semiconductor industry is carried out with the help of semiconductor assembly machines, which are known to skilled persons as "die bonders" or pick and place machines. The devices are often semiconductor chips that can be placed and bonded on different substrates at predefined substrate positions.

The components are picked up by a pick-up member, such as a clamping gripper or a suction element. The pick-up member is moved over the substrate and the components are placed at the predefined positions on the substrate. The pick-up member may be mounted on a bonding head so that it may rotate about its longitudinal axis. The bonding head is attached to a pick-and-place system that allows the required movements in the three spatial directions X, Y and Z. The bonding head is attached to the bonding head by means of a special mounting bracket. In practice, the Z direction corresponds to the vertical direction, the XY plane to the horizontal plane. In addition to the highly precise positioning of the components in the XY plane, it is very important that the components are placed plane-parallel and without shear forces on the substrate. Inclined placement of the components may lead to undesirable properties such as reduced holding force, inadequate or missing electrical contacts, irregular heat transfer between components and substrate, or damage to the components. Shear forces may cause the semiconductor chip to slip.

SUMMARY

The invention is aimed at an apparatus and method for mounting devices on a substrate. Processing is often interrupted during operation because the components are not provided for assembly parallel to the substrate. Inclination control solutions increase the cost, weight and complexity of the bonding head.

By tilting the contact surface using existing drives and/or actuators, simplified tilt correction is made possible, providing high throughput and high reliability. The tilt correction mechanism consists of one or more engagement members, one or more adjustment members and one or more tilt position blocks. In some cases, passive elements and mechanisms may be used.

DETAILED DESCRIPTION

Many different configurations are known for controlling the inclination of the pick-up member. The aim of the invention is to enable improved inclination control during the placement of components from a substrate.

In addition, the invention has the task of providing a simple and inexpensive possibility of inclination control during manufacture, which, while maintaining simple handling, has the longest possible and almost wear-free inclination mechanism for a bonding head during use.

In a first aspect of the invention, a process is provided for mounting devices on a substrate, which provides a substrate on a substrate base at a substrate location. The procedure includes the following steps: providing a bonding head displaceable relative to the substrate along a first movement axis and a second movement axis, the second movement axis being substantially perpendicular to the first movement axis; providing a pickup as a receiving element having a contact surface, wherein the pickup is disposed on the bonding head, and wherein the contact surface is configured and arranged to be releasably or releasably attachable to the components, and the contact surface is further configured and arranged to be rotatable about the first movement axis; providing a first engagement member disposed on the bonding head; providing a first adjustment member in a first adjustment position for rigid engagement with the first adjustment member; moving the bonding head to the first adjustment position; rigidly engaging the first adjustment member with the first adjustment member; displacing the bonding head along the first movement axis or along the second movement axis relative to the first adjustment member, the contact surface rotating about the second movement axis; releasing the first engagement member from the first adjustment member; and displacing the bonding head to the substrate position, the bonding head maintaining the rotation of the contact surface about the second movement axis.

By providing tilt correction with conventional drives and/or actuators and their movement along the respective motion axes, the assembly of the components may be considerably simplified. In particular, the complexity of the bonding head (and any parts or elements attached to it) may be reduced—this may in particular reduce the cost of the device itself. In addition, the weight may be reduced so that the bonding head (and any parts or elements attached to it) may move much faster than is possible with conventional apparatus. Rotation correction may only be carried out according to mechanical principles—such passive embodiments ensure a high degree of complexity and/or weight reduction.

In a further aspect of the invention, a method is provided for mounting devices on a substrate, the method further comprising the following steps provided: configuring and arranging the bonding head to be displaceable relative to the substrate along a third movement axis, the third movement axis being substantially perpendicular to the first movement axis and substantially perpendicular to the second movement axis; configuring and arranging the contact surface so as to be rotatable about the third movement axis; after rigidly engaging the first engagement member with the first adjustment member, displacing the bonding head along the first movement axis or along the second movement axis or along the third movement axis relative to the first adjustment member, the contact surface rotating about the third movement axis; and after releasing the first engagement member from the first adjustment member, displacing the bonding head to the substrate position, the bonding head maintaining the rotation of the contact surface about the third movement axis.

After positioning, the components are preferably mounted plane-parallel to the substrate at the substrate position—by providing the required degrees of rotation around two movement axes, the risk of an inclination problem during operation may be significantly reduced.

In a further aspect of the invention, a method is provided for mounting devices on a substrate, the method further comprising the following steps provided: configuring and arranging the bonding head to be displaceable relative to the substrate along a third movement axis, the third movement axis being substantially perpendicular to the first movement axis and substantially perpendicular to the second movement axis; configuring and arranging the contact surface so as to be rotatable about the third movement axis; providing a second engagement member disposed on the bonding head; providing a second adjustment member in a second adjustment position, the second adjustment member configured and arranged to rigidly engage the second engagement member; moving the bonding head to the second adjustment position; rigidly engaging the second engagement member with the second adjustment member; moving the bonding head along the first movement axis or along the second movement axis or along the third movement axis relative to the second adjustment member, the contact surface rotating about the third movement axis; releasing the second engagement member from the second adjustment member; and moving the bonding head to the substrate position, the bonding head maintaining the rotation of the contact surface about the third movement axis.

By providing two engagement members, two adjustment members and two adjustment positions, a preferred implementation of the invention may be achieved in such a way that even the time required to move from setting the first inclination to setting the second inclination may be significantly reduced.

This is also due to the lower mass to be moved, the bonding head, which results from the avoidance of additional servomotors at the bonding head.

In a preferred method, the bonding head is configured and arranged to maintain the rotation of the contact surface using an elastic member, a spring member, a magnetic member, an electrical member, an electromagnetic member, a vacuum member, a gas-powered member, a friction member, a hydraulic member, an inductive member, or any combination thereof.

In another aspect of the invention, a preferred method for entering item data still involves the following steps: providing an inclination measuring device configured and arranged to measure the rotation of the contact surface about the first and/or second movement axis and/or about the third movement axis; providing a processor configured and arranged to determine the degree of displacement along the first movement axis to obtain a desired rotation about the first and/or second movement axis and/or about the third movement axis; and further configuring and arranging the processor to stop the displacement along the first movement axis when the desired inclination of the contact surface is reached.

In another aspect of the invention, a preferred method for entering item data still involves the following steps: providing an inclination sensor configured and arranged to measure an inclination of the substrate; and providing a processor configured and arranged to determine the degree of displacement along the first movement axis to obtain a desired rotation about the first and/or second movement axis and/or about the third movement axis using the measured inclination of the substrate.

In another aspect of the invention, a preferred method of temperature sensing, preferably also in the machine environment, continues to include the following steps: providing a temperature sensor configured and arranged to measure a temperature and/or a respective temperature of the bonding head receiving carrier and/or the bonding head receiving and/or the bonding head and/or the sensor and/or the contact surface; and providing a processor configured and arranged to determine the degree of displacement along the first movement axis to obtain a desired rotation about the second movement axis and/or about the third movement axis using the measured temperature of the contact surface.

In another aspect of the invention, a preferred method of temperature sensing, preferably also in the machine environment, continues to include the following steps: providing a temperature sensor configured and arranged to measure a temperature and/or a respective temperature of the substrate (160) and/or substrate base, and providing a processor configured and arranged to determine the degree of displacement along the first movement axis to obtain a desired rotation about the first and/or second and/or third movement axis using the measured temperature of the substrate.

The invention involves temperature measurement by means of temperature sensors and/or non-contact temperature measurement by means of radiation such as laser-based or infrared-based temperature measurement.

In another aspect of the invention, a preferred method for controlling the rotation of the contact surface of the pick-up member continues to include the following steps provided: Measuring the inclination and/or rotation of the bonding head and/or to the contact surface and/or of a bonded component relative to the substrate, wherein at least the position of the bonding head may be optically detected by means of a reference mark; determining a compensation variable for compensation of the inclination and/or rotation from the measurements; moving the bonding head to a first position to be compensated with the compensation variable; rigidly engaging said first engagement member with said first adjustment member; performing a first compensation; moving said bonding head to a second position to be compensated with said compensation size; rigidly engaging said second engagement member with said first adjustment member; performing a second compensation.

In addition, it may be advantageous to re-measure the tilt of the bonding head relative to the surface of the substrate or to the surface of a substrate handler and use it for additional compensation.

The measurement of the tilt, i.e. the inclination and/or rotation of the bonding head relative to the substrate is preferably carried out with an optical image recognition method, whereby a preferably optical reference mark, for example a so-called fiducial attached to the bonding head, is detected by a camera and used for referencing. In this way, an advantageous continuous monitoring is also possible during the movement sequences during mounting. A situation-related compensation, for example caused by mechanical play or simple error propagation of mechanical deviations, is thus made available.

In another aspect of the invention, a device is provided for mounting devices on a substrate. The device is configured and arranged to perform the procedures described herein.

A preferred configuration of a device for mounting devices on a substrate provided at a substrate position comprises a bonding head displaceable relative to the substrate along a first movement axis and a second movement axis, the second movement axis being substantially perpendicular to the first movement axis; a pick-up member having a contact surface, the pick-up member being disposed on the bonding head, the contact surface being configured and arranged to be releasably or re-releasably attachable to components, the contact surface further being configured and arranged to be rotatable about the first movement axis; a first engagement member disposed on the bonding head; a first adjustment member in a first adjustment position for rigid engagement with the first engagement member.

In addition, preferred configurations of a device for mounting devices on a substrate include a bonding head displaceable to the first displacement position, the first engagement member being rigidly engaged with the first displacement member; wherein, during engagement, the bonding head is displaceable relative to the first displacement member along the first movement axis or along the second movement axis, and the contact surface rotates about the first movement axis.

In addition, preferred embodiments of a device include a first engagement member which is releasable or re-releasable from the first adjustment member.

In addition, preferred forms of execution of a device include a bonding head displaceable to the substrate position, the contact surface being configured and arranged to maintain rotation about the first movement axis.

In preferred configurations of a device for mounting devices on a substrate, the bonding head is further configured and arranged to be displaceable relative to the substrate along a third movement axis, the third movement axis being substantially perpendicular to the first movement axis and substantially perpendicular to the second movement axis.

In preferred embodiments of a device for mounting devices on a substrate, the contact surface is further configured and arranged to be rotatable about the third movement axis.

In preferred configurations of a device for mounting devices on a substrate, the first engagement member is further configured and arranged to slide the bonding head along the first movement axis or along the second movement axis or along the third movement axis relative to the second adjustment member, the contact surface rotating about the third movement axis.

In preferred embodiments of a device for mounting devices on a substrate, the bonding head is further configured and arranged to maintain rotation of the contact surface about the third movement axis after disengagement from the first adjustment member.

In preferred configurations of a device for mounting devices on a substrate, the bonding head is further configured and arranged to be displaceable relative to the substrate along a third movement axis, the third movement axis being substantially perpendicular to the first movement axis and substantially perpendicular to the second movement axis.

In preferred configurations of a device for mounting devices on a substrate, the contact surface is further arranged to be rotatable about the third movement axis, the device further comprising a second engagement member disposed on the bonding head and a second adjustment member in a second adjustment position, the second adjustment member being configured and arranged to rigidly engage the second engagement member, the bonding head further being displaceable to the second adjustment position, the second engagement member being rigidly engaged with the second adjustment member, and the bonding head being displaceable relative to the second adjustment member along the first movement axis or along the second movement axis or along the third movement axis, the contact surface rotating about the third movement axis, and the second engagement member being releasable from the second adjustment member, and the bonding head being further configured and arranged to maintain rotation of the contact surface about the third movement axis after release from the second adjustment member.

BRIEF DESCRIPTION OF THE DRAWINGS

Further advantages and properties of a preferred method for mounting devices on a substrate and a preferred device for mounting devices on a substrate are shown in the following figures.

DETAILED DESCRIPTION OF THE PREFERRED EMBODIMENTS

Figure 1:
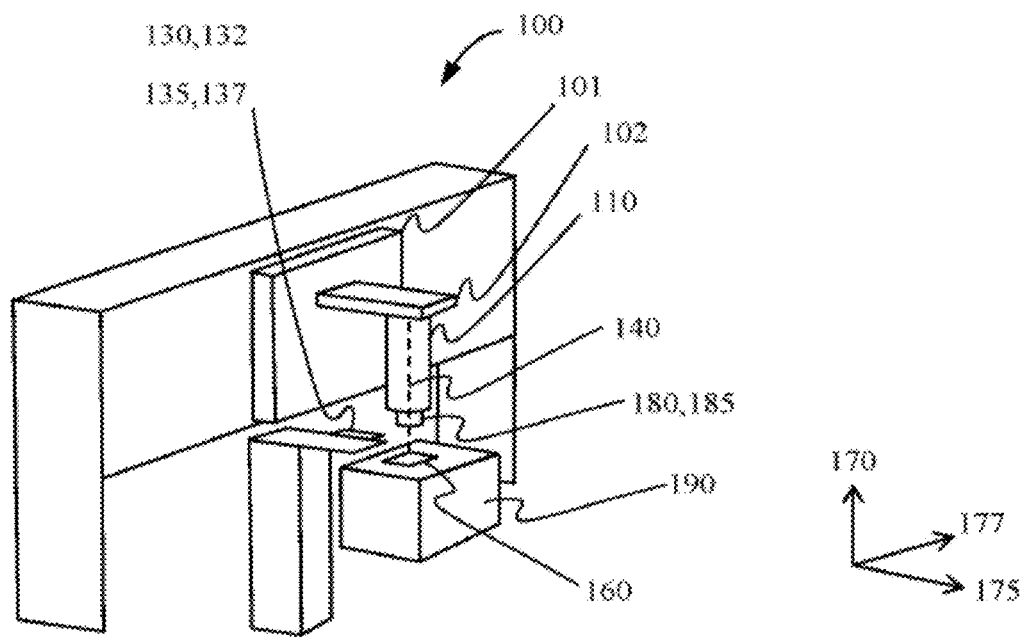
FIG. 1 shows an embodiment of a device for mounting components in the sense of the invention.

FIG. 1 shows a preferred embodiment of an apparatus 100 for assembling components 150 in the form of an assembly apparatus 100, such as a die bonder or an assembly machine, as required for understanding the method 200 according to the invention. Method 200 is used for mounting electronic or optical components 150 (not illustrated), in particular semiconductor chips, on a substrate 160. The assembly apparatus 100 comprises a movable bonding head 110 to which a pick-up member 180 is attached as a receiving element, such as a suction element or a clamping gripper. The assembly apparatus 100 also includes a substrate base 190 on which the substrate 160 rests and is held.

The assembly apparatus 100 is configured and arranged to displace the bonding head 110 and/or the pick-up member 180 relative to the substrate 160 along a first movement axis 170, which is represented here as a substantially vertical direction or Z-direction. Typically, the apparatus is configured and arranged such that a longitudinal axis 140 of the bonding head 110 and/or pick-up member 180 substantially coincides with the substantially vertical direction or Z-direction 170.

The assembly apparatus 100 is further configured and arranged such that the bonding head 110 and/or the pick-up member 180 may be shifted relative to the substrate 160 along a second movement axis 175, shown here as a substantially horizontal or X direction. The second movement axis 175 is substantially perpendicular to the first movement axis 170.

The assembly apparatus 100 is further configured and arranged such that the bonding head 110 and/or the pick-up member 180 may be shifted relative to the substrate 160 along a third movement axis 177, shown here as a substantially horizontal direction or Y-direction. The third movement axis 177 extends substantially perpendicularly to the first movement axis 170 and also substantially perpendicularly to the second movement axis 175. In the apparatus 100 shown, the XY plane is spanned by the second movement axis 175 and the third 177 movement axis.

The configuration of the apparatus 100 typically uses electrically and/or pneumatically driven axes for the motion to provide the relative motion, wherein the pick-up member 180 and/or substrate 160 are configured and arranged to move along one or more movement axes 170, 175, 177. Since relative motion is required, the motion may be configured for the substrate base 190, for the pick-up member 180, for the contact surface 185, for the bonding head 110, a mounting point of the bonding head 110 to the remaining apparatus 100, or any combination thereof.

Such a movement axis 170, 175, 177 may consist of a guide (not shown) and a movable part, e.g. a carriage movable in the guide. The carriage may be supported in different ways, e.g. by an air bearing or a ball bearing. There may be a certain elasticity between the guides and the movable slides, which is typically somewhat greater in an air bearing than in a ball bearing. For each movement axis, one or more guide carriage combinations may be provided at different points in the apparatus 100. Each movement axis may also consist of one or more drives (not shown) to move the associated slide along the associated guide.

A relative displacement between the bonding head 110 and the pick-up member 180 as receiving element may also be provided in one or more movement axes 170, 175, 177. Additionally or alternatively, the device 100 may be configured to allow relative rotation between the pick-up member 180 and the bonding head 110 around its longitudinal axis 140. A bearing of the pick-up member 180 at the bonding head 110 may be provided as an air bearing.

The pick-up member 180 consists of a contact surface 185 (not shown) for releasable or re-releasable attachment to components 150 during positioning on the substrate 160 at a substrate position 165 (not shown).

After a component 150 has been positioned (or placed) on the substrate 160, the contact area 185 is typically used to limit the movement of the device during one or more bonding operations. The force exerted by the contact surface 185 on the substrate 160 is usually referred to as the holding force. Typically, the same contact area 185 is used for each step of the bonding process, with each step using an additional contact area 185 depending on the type of bonding.

Since the bonding head 110 and the pick-up member 180 are connected to each other and the pick-up member 180 comprises the contact surface 185, it will be obvious to the skilled person that the position of the contact surface 185 may be derived from the position of the bonding head 110 and/or the pick-up member 180 with corresponding conversion rules or vice versa.

Preferably, the components 150 are positioned substantially parallel to the substrate 160 at their respective substrate positions 165. This means that the components 150 are preferably positioned in an XY plane which is substantially plane-parallel to the XY plane in which the substrate position 165 is located. Deviations from the plane-parallel condition are referred to as inclination, tilting or twisting—inclined, twisted or tilted positioning of components 150 may lead to undesirable properties such as reduced holding force and/or holding force, inadequate or missing electrical contacts, irregular heat transfer between components 150 and substrate 160 or damage to components 150. Shear forces may cause the components 150 to slip, which may lead to a positioning error. In extreme cases, the components may not function properly, be defective or have reduced reliability.

To enable tilt adjustment, the apparatus 100 is further configured and arranged so that the bonding head 110 and/or the pick-up member 180 may be rotated relative to the substrate 160 about at least one horizontal axis—the second 175 and/or the third movement axis 177—relative to the substrate 160. In general, the highest degree of control is achieved by many degrees of motion and rotation (degrees of freedom), but this typically increases the complexity of the apparatus 100.

With conventional placement machines, the inclination of the contact surface 185 is adjusted manually by an operator—after detection of a problem, e.g. breakage of the components 150 and/or the substrate 160, the device operation is interrupted, and the inclination is adjusted manually, e.g. with an adjusting screw.

With appropriate control and/or measurement, this one or more rotation angles may be used to control the orientation of the contact surface 185 relative to the substrate 160 to minimize tilt error. Each degree of rotation requires one or more drives or actuators. In addition, a measurement system, such as one or more measuring instruments, may be required to ensure the required accuracy and control. Since relative motion is required, rotation may be configured for substrate base 190, pick-up member 180, bonding head 110, contact surface 185, a bonding head 110 attachment point to the rest of apparatus 100, or any combination thereof.

Such additional drives and measuring systems increase the weight of the bonding head 110 and/or the pick-up member 180, which may limit the maximum speed, typically measured in UPH (Units Per Hour), or require more powerful drives to compensate for the increased inertia. The size of the bonding head 110 and/or pick-up member 180 may also increase as elements are added.

Figure 5:
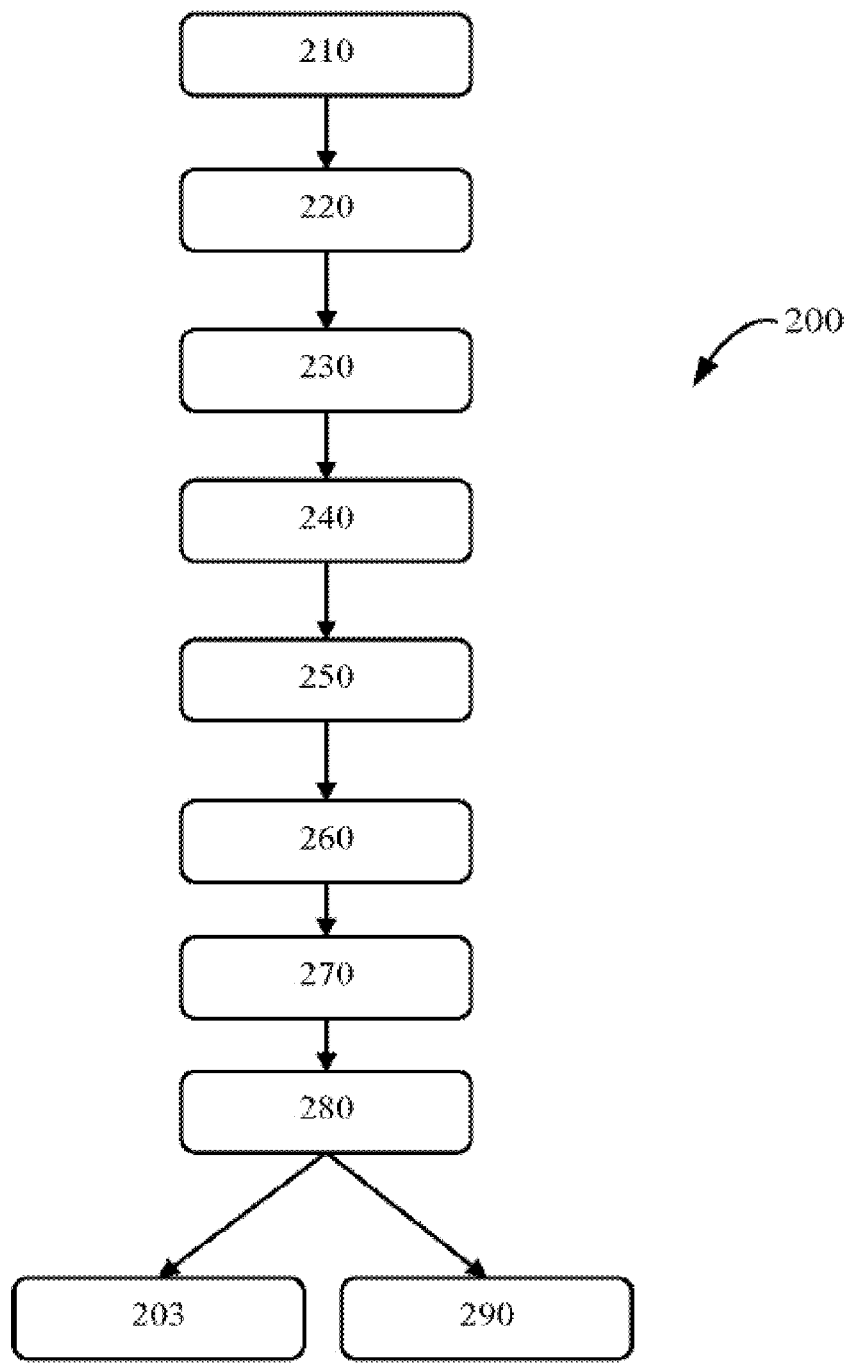
FIG. 5 illustrates a method of mounting components on a substrate in the sense of the invention.

For example, U.S. Pat. No. 8,387,851 B1 describes an inclination adjustment with active actuators mounted directly on the bonding head. As shown in FIG. 5 of U.S. Pat. No. 8,387,851 B1, the inclination adjustment is implemented with several actuators and encoders.

Depending on the invention, an improved tilt adjustment is provided in the apparatus 100, which allows an automatic adjustment with simultaneous minimization of the weight and/or size increase of the bonding head 110 and/or the pick-up member 180. In addition, the setting time may be shortened, which increases the operating time of the apparatus 100.

Figure 2:
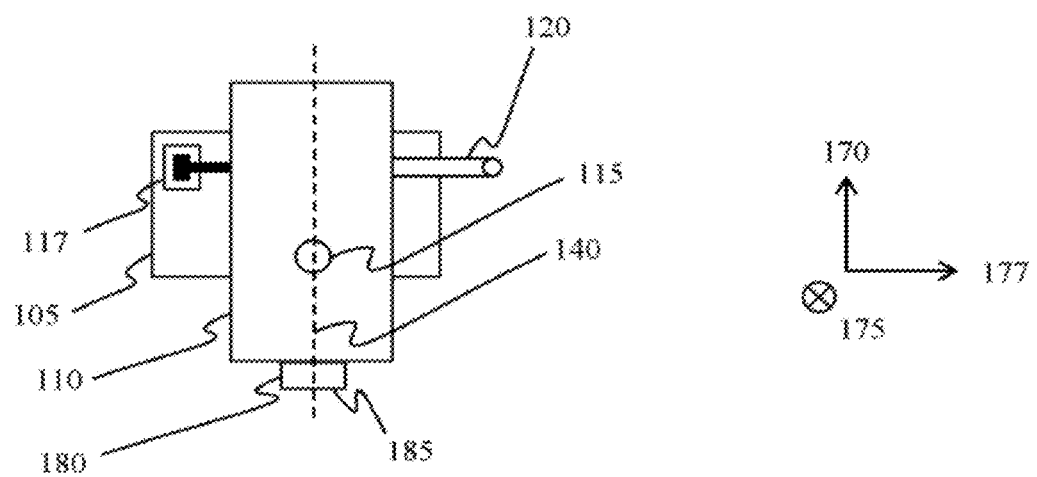
FIG. 2 shows an example of a bonding head configured and arranged to rotate around a second movement axis.

FIG. 2 shows an example of a bonding head 110 that is arranged to rotate about the second movement axis 175.

The left view in FIG. 2 schematically shows the bonding head 110 and the pick-up member 180—their longitudinal axis 140 is also shown to illustrate the possible relative rotation. On the right side the coordinate system is shown—the first movement axis 170 (Z) is shown vertically and the third movement axis 177 (Y) horizontally. In this example, the bonding head 110 is viewed along the second movement axis 175 (X), i.e. the second movement axis 175 (X) goes into the page (paper plane).

In this example, the bonding head 110 is configured and arranged to rotate about the second movement axis 175 (X)—in this example, the bonding head 110 is pivotally connected to the remaining apparatus 100 via a bonding head attachment 105, allowing rotation about the pivot point 115.

The apparatus 100 further comprises a first engagement member 120 attached to the bonding head 110 and a first adjustment member 130 at a first adjustment position 132 (shown in FIG. 1) for rigidly engaging the first engagement member 120.

The first adjustment position 132 may be located anywhere that the bonding head 110 can reach with the available motion axes or degrees of freedom.

The apparatus 100 is further configured and arranged so that the bonding head 110 may be moved to the first adjustment position 132, with the first engagement member 120 rigidly engaging the first adjustment member 130.

This means that when the bonding head 110 is moved to the first adjustment position 132, the first engagement member 120 and the first adjustment member 130 are configured and arranged so that they may be rigidly switched on and off. The first engagement member 120 and the first adjustment member 130 form the first pair of engagement members. They may be designed e.g. as rack and pinion pair, ball and socket, hook and guide, bolt and nut, projection and recess, bolt and hole pair, north and south magnetic poles or projection and clamping pair. More than one pairs of engagement members may also be used.

Optionally, each pair of engagement members may be configured to use only mechanical principles. This passive embodiment may avoid additional weight and complexity due to electrical or pneumatic supply and/or drives.

The skilled person will realise that the members of an engagement pair may exchange their mechanical configuration without affecting the functionality of the pair. For example, a rack may be included as an engaging member in combination with a pinion as an adjusting member or a rack may be included as an adjusting member in combination with a pinion as an engagement member.

Rigid engagement means that the engagement is of sufficient rigidity and duration to perform the required tilt adjustment and depends, inter alia, on the mechanical configuration selected for the engagement pair, the selected tilt adjustment mechanism (see below), the required adjustment speed, the required adjustment accuracy and the mass of the bonding head 110.

The first engagement member 120 shown in FIG. 2 is a cylindrical pin selected to engage rigidly in a groove (not shown).

The apparatus 100 is further configured and arranged such that during engagement the bonding head 110 is displaceable along the first movement axis 170 relative to the first adjustment position with the contact surface 185 rotating about the second movement axis 175; and upon release of the first engagement member 120 from the first adjustment member 130, the bonding head 110 is displaceable to the substrate position 165 and the contact surface 185 is configured and arranged such that rotation about the second movement axis 175 is maintained.

As shown in the example in FIG. 2, a tilt position block 117 is provided to maintain rotation about the second movement axis 175, i.e. tilt adjustment about the second movement axis 175. The tilt position block 117 may also be seen as blocking an unwanted tilt movement around the second movement axis 175.

Any standard motion lock may be used, such as a friction brake, a hydraulic brake, a pneumatic brake, a screw thread, an electromagnetic brake, an electric brake, an induction brake, a screwdriver, a magnetic brake or any combination thereof. An elastic member may also be used to generate an appropriate preload.

Optionally, tilt position block 117 may be configured to use only mechanical principles. This passive embodiment may avoid additional weight and complexity due to electrical or pneumatic supply and/or drives.

In the example of FIG. 2, the apparatus 100 is configured and arranged such that the bonding head 110 may rotate about the pivot 115 (and about the second movement axis 175) when a corresponding force is applied to the tip (distal end) of the first engagement member 120 along the third movement axis 177.

For the invention, the inclination of the contact surface 185 is advantageously adjusted before the components 150 are mounted on the substrate 160, so that the inclination of the contact surface 185 is substantially equal to the inclination of the substrate 160 at the respective substrate position 165. Although the example in FIG. 2 shows a configuration and arrangement for controlling the tilt of the bonding head 110, the tilt set and/or setting is selected to achieve the required tilt of the contact surface 185. FIG. 2 shows the pick-up member 180 attached to the end of the bonding head 110 and working closest to the substrate 160. The pick-up member 180 consists of the contact surface 185 at the end of the pick-up member 180 furthest from the bonding head 110. The skilled person will therefore recognize that from the knowledge of the relevant dimensions of the apparatus 100 the inclination values of the bonding head 110 may easily be converted and vice versa. Alternatively or additionally, such conversion values may be measured with a suitable calibration procedure.

In the example of FIG. 2, the tilt adjustment and tilt blocking are implemented in the bonding head 110, since, in practice, this offers sufficient space for the additional components and typically has sufficient mass to enable a robust and reliable implementation.

Alternatively or additionally, an inclination adjustment and an inclination lock may be provided in the pick-up member 180 or even in the bearing surface 185. The use of a plurality of tilt adjustment and tilt locking functions is also provided, allowing coarse and/or fine adjustment.

FIG. 3 shows the use of the configuration and arrangement of FIG. 2 for the assembly of components on a substrate according to the method 200 of the invention. The possible steps of the procedure are also shown in FIG. 5.

Figure 3A:
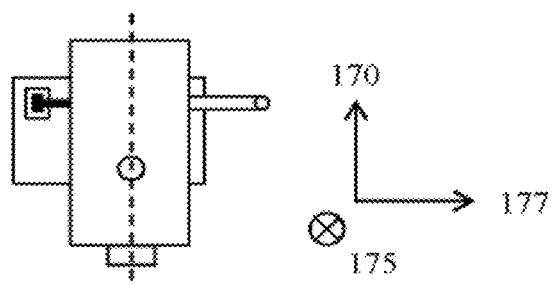
FIGS. 3A to 3D show the use of the configuration and arrangement from FIG. 2 for mounting devices on a substrate.

FIG. 3A shows the same view of the bonding head 110 shown in FIG. 2 and the same coordinate system. The reference numbers have not been included to improve the clarity of FIG. 3—the elements shown in FIG. 2 are identical.

Figure 3B:
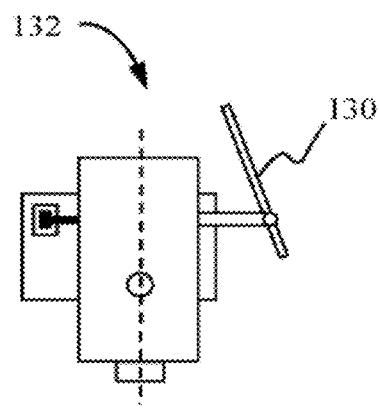

In FIG. 3B, the bonding head 110 is moved 250 to the first adjustment position 132. At this point, the first engagement member 120 and the first adjustment member 130 are close together.

The first engagement member 120 is then rigidly engaged with the first adjustment member 130. The required actions depend, among other things, on the configuration and arrangement of the first pair of engagement members 120, 130. The apparatus 100 may be configured and arranged to rigidly engage 260 as a direct result of moving the bonding head 110 to the first adjustment position 132.

Alternatively or additionally, a sequence of movements along the available movement axes 170, 175, 177 may be made until the first pair of engagement members 120, 130 are close to each other. For example, the embodiment of FIG. 3 requires a pin contained in engagement member 120 to penetrate a groove in adjustment member 130. As shown, both the pin 120 and the groove 130 extend along the second movement axis 175 into the paper plane. Engagement may therefore take place by moving the bonding head 110 to a first adjustment position 132, which is defined so that the pin 120 is positioned just above the groove 130, allowing freedom of movement along the first movement axis 170 and the third movement axis 177. The bonding head 110 may then be moved along the second movement axis 175 into the paper, allowing the pin 120 to enter the groove 130. Rigid engagement 260 may thus be achieved by appropriately selecting the mechanical tolerances of the pin 120 and the groove 130 and maintaining a fixed position along the second movement axis 175 when the tilt 270 is set (see below).

In addition or alternatively, a clamp may be used to ensure that the rigidity of the engagement is sufficient.

The arrangement of the first pair of engagement members 120, 130 is a pin 120 in a groove 130 arranged at an angle of about 20 degrees to the first movement axes 170 (Z) in a YZ plane. In this example, the third movement axis 177 is defined as Y. The movement of the bonding head 110 along the first movement axes 170 provides a force on the first engagement member 120 along the third movement axes 177. As shown, an upward movement 170 provides a force to the left 177 and a downward movement 170 provides a force to the right 170. A groove with a larger angle, e.g. between 30 degrees and 60 degrees, may also be used.

The apparatus 100 is configured and arranged such that a force on the first engagement member 120 along the third movement axis 177 causes the bonding head 110 to rotate about the pivot 115 (about the second movement axis 175).

The apparatus 100 is configured and arranged such that rotation of the bonding head 110 about the pivot 115 (about the second movement axis 175) causes rotation (or inclination) of the contact surface 185 about the second movement axis 175.

It is advantageous that the invention provides an inclination of the contact surface 185 with the already existing drives and actuators for the displacement of the bonding head along the movement axes 170, 175, 177. No additional drives and/or actuators are required for this inclination.

Figure 3C:
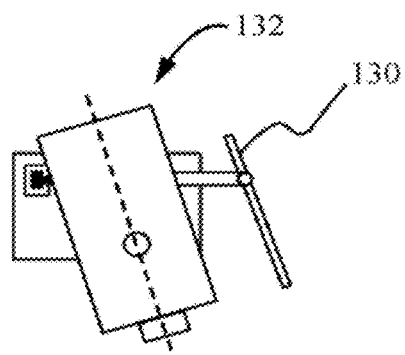

FIG. 3C shows the counterclockwise rotation of the bonding head 110 about the second motion axes 175 by moving the bonding head 110 270 upwards along the first motion axes 170.

The first engagement member 120 is then uncoupled from the first adjustment member 130. The tilt (rotation about the second movement axis 175) is maintained by the tilt position block 117. If a friction brake is used that provides sufficient friction, the bonding head 110 may be adjusted to any tilt value in the tilt mechanism area by simply exerting the appropriate force on the engaging member 120—no further action is required to block the tilt. If the tilt position block 117 provides a plurality of blocking degrees, it may be advantageous to provide less blocking during rotation of the bonding head 110, and more blocking prior to releasing the first engagement member 120 and the first adjustment member 130. Alternatively or additionally, the tilt position block 117 may be configured and arranged to have a higher blocking degree during each movement of the bonding head 110 upon disengagement 280.

Figure 3D:
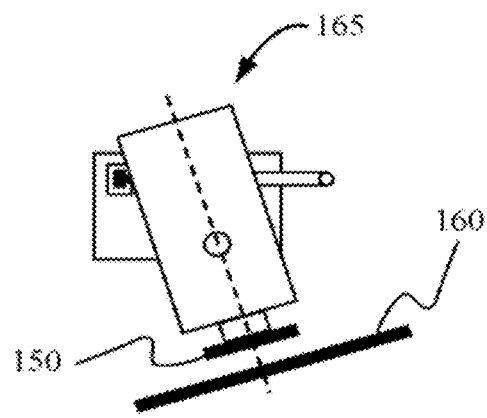

After disengaging 280, the bonding head 110 is moved to the respective substrate position 165 on substrate 160. As shown in FIG. 3D, the bonding head 110 has maintained rotation about the second movement axis 175 and thus the inclination of the contact surface 185 about the second movement axis 175. The bonding head 110 reaches the respective substrate position 165 when the contact surface 185 is directly above the position on the substrate where the respective component 150 is to be mounted. Depending on the tilt setting, the expected position may therefore be corrected.

As shown in FIG. 3D, a component 150 is attached to the contact surface 185, with the component tilt around the second movement axis 175 being substantially equal to the substrate tilt 160 around the second movement axis 175.

It is not necessary to fetch component 150 after inclination adjustment (FIG. 3B and FIG. 3C)—the apparatus 100 may be configured to perform inclination adjustment while a component 150 is attached to contact surface 185.

Many variants of this embodiment are possible if two aspects are implemented—the apparatus 100 is configured in such a way that
- a displacement along at least one movement axis 170, 175, 177 results in an inclination of the contact surface 185; and
- the intended inclination is maintained when components 150 are mounted on substrate 160.

The above describes the use of the motion of the bonding head 110 along the first movement axis 170, which is represented as Z or substantially vertical, to rotate the second movement axis 175, which is represented as X or substantially horizontal.

The invention is based on the knowledge that tilt correction is possible with existing drives and/or actuators that allow motion along at least one of these motion axes 170, 175, 177. In general, apparatus 100 may be configured and arranged to use a motion along one movement axis to allow rotation about another movement axis, with the axes substantially perpendicular to each other:

| Movement along | | Turn around |
|---|---|---|
| of the first movement axis 170 | enables | the second movement axis 175 |
| of the first movement axis 170 | enables | the third movement axis 177 |
| of the second movement axis 175 | enables | the first movement axis 170 |
| of the second movement axis 175 | enables | the third movement axis 177 |
| the third movement axis 177 | enables | the first movement axis 170 |
| the third movement axis 177 | enables | the second movement axis 175 |

Therefore, when interpreting the "first", "second" and "third" movement axes, all combinations of axes which are substantially perpendicular to each other fall within the scope of protection of the claims and not only the examples marked X, Y and Z in the description.

In particular, the movement axes X and Y may be functionally interchanged.

The apparatus 100 may also be configured and arranged to provide more than one tilt according to the invention.

FIG. 4 shows another version of the invention, which is a modified version of the embodiment depicted in FIG. 2.

Figure 4A:
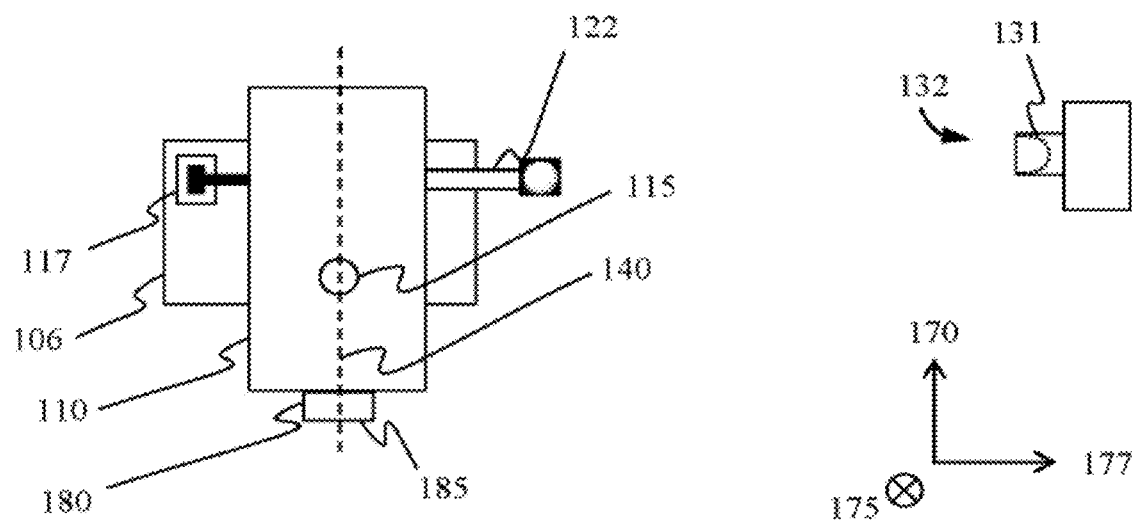
FIGS. 4A and 4B represent a modified version of the embodiment shown in FIG. 2.

The left view in FIG. 4A shows schematically the bonding head 110 and the pick-up member 180. On the right side the coordinate system is shown—the first movement axis 170 (Z) is shown vertically and the third movement axis 177 (Y) horizontally. In this example, the bonding head 110 is viewed along the second movement axis 175 (X), i.e. the second movement axis 175 (X) goes into the page. From this point of view, the apparatus 100 and the bonding head 110 appear as shown in FIG. 2. The rotatability around the pivot 115 and thus the second movement axis 175 is the same. The differences are:

the further bonding head attachment 106 is modified compared to the one shown in FIG. 2—here the bonding head 110 is also rotatable about the third movement axis (see FIG. 4B below); and the other engagement member 122 is modified in comparison with FIG. 2 to allow a rigid engagement allowing rotation about two axes. In this simple example, the further engagement member 122 consists of a ball (or partially spherical-shaped) at its distal end.

The associated additional adjustment member 131 is provided at the first adjustment position 132 and may, for example, be an appropriately dimensioned socket, recess or groove. Here is shown a socket, which is arranged along third movement axis 177. A rigid engagement may be effected by moving the bonding head 110 to the first adjustment position 132 such that the ball is aligned at the distal end of the further engagement member 122 along the first 170 and second 175 movement axes, followed by displacement along the third 177 movement axes, allowing rotation about the pivot 115 and thereby rotation (inclination) of the contact surface 185 about the second 175 axis.

Figure 4B:
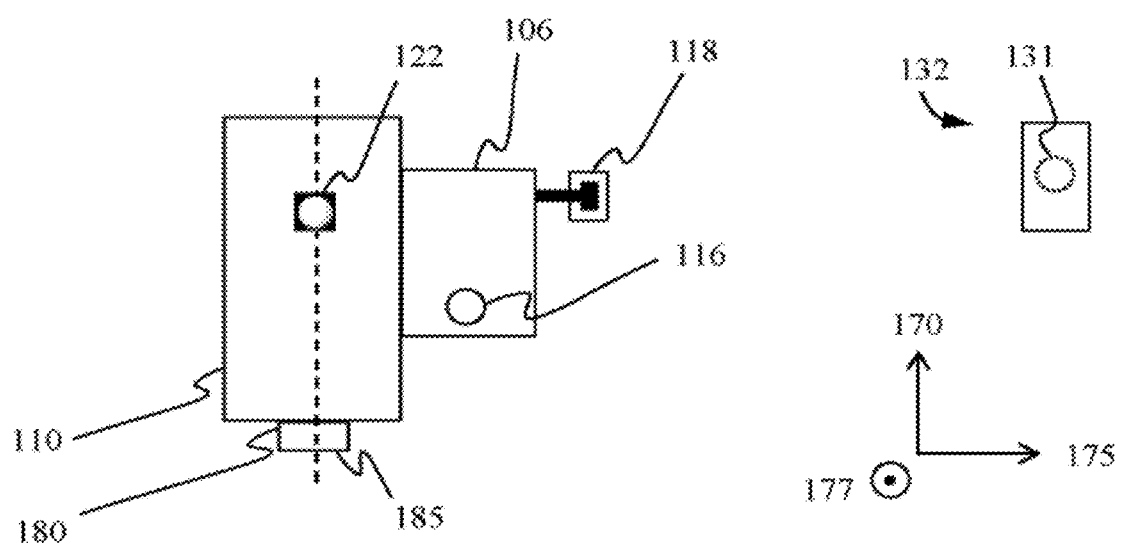

The left view in FIG. 4B shows schematically the bonding head 110 and the pick-up member 180. On the right side the coordinate system is shown—the first movement axis 170 (Z) is shown vertically and the second movement axis 175 (X) horizontally. The bonding head 110 in this example is viewed along the third movement axis 177 (Y)—in other words, the third movement axis 177 (X) comes out of the page (paper plane}. In this example, the bonding head 110 is also configured and arranged to rotate about the third movement axis 177 (Y)—the bonding head 110 is pivotally connected to the remaining apparatus 100 via a further bonding head attachment 106, which also facilitates rotation about the further pivot 116 and about the third movement axis 177. A further tilt position block 118 is mounted between the further bonding head attachment 106 and the remaining apparatus 100 to maintain rotation about the third movement axis 177—i.e. tilt adjustment about the third movement axis 177. The further tilt position block 118 may also be seen as blocking unwanted tilting movements around the third movement axis 177. Optionally, the additional tilt position block 118 may also be configured to use only mechanical principles (passive version). The associated further adjustment member 131 at the first adjustment position 132 is shown in the third movement axis 177—socket 131 is invisible here and therefore marked with a dashed line. The rigid engagement is performed in the same manner as in FIG. 4A—moving the bonding head 110 so that the ball 122 is aligned along the first 170 and second 175 movement axes followed by movement along the third 177 movement axes, and subsequent movement along the second 175 movement axis at substantially constant positions along the first 170 and third 177 movement axes facilitates rotation about the further pivot 116 and thus rotation (inclination) of the contact surface 185 about the third 177 movement axis.

In summary, in the example of FIG. 4, the apparatus 100 is configured and arranged so that the bonding head 110 may rotate:

about said pivot 115 (and about said second movement axis 175) when a corresponding force is applied to said tip (distal end) of further engagement member 121 along said third movement axis 177; and about the further pivot 116 (and about the third movement axis 177) when a corresponding force is exerted on the tip (distal end) of the further engagement member 121 along the second movement axis 175.

The advantage is that the components 150 for the mounting process are preferably parallel to substrate 160 at substrate position 165—the required inclination by two movement axes reduces the risk of an inclination problem interrupting the operation of the apparatus 100.

It is obvious to the skilled person that different configurations and movements may be used to ensure the same rotation.

In FIG. 4A, for example, the movement of the bonding head 110, after latching along the third movement axis 177 to socket 131, causes the contact surface 185 to rotate about the second movement axis 175. In the configuration shown, a movement from socket 131 along the third movement axis 177 may result in disengagement. However, by providing a different type of mesh pair, e.g. pinion and racks disposed in both directions, these may also be provided.

A single engagement member may also be used with more than one adjustment member at more than one engagement position each. For example, in the case of a spherical engagement member, an additional socket may be provided at a further adjustment position.

Adjustment positions are considered different if the rigid engagement cannot be maintained because the bonding head 110 is moved between these latching positions—for FIGS. 4A and 4B, the adjustment positions are not considered different. The apparatus 100 may be configured to provide at these different positions: rotation around the same movement axis, different degrees of rotation around the same movement axis, rotation around different motion axes, different rotation directions around the same movement axis and any combination thereof.

A single adjustment member may also be used with more than one engagement member at more than one adjustment position each. If, for example, the bonding head 110 is equipped with two spherical engagement members, a socket may be provided in the apparatus 100. The invention has two adjustment positions, since a rigid engagement is not possible, since the bonding head 110 is moved between the two adjustment positions. The apparatus 100 may be configured so that it is at these different positions: Rotation around the same movement axis, different degrees of rotation around the same movement axis, rotation around different motion axes, different rotation directions around the same movement axis and any combination thereof.

One or more engagement members may also be used with one or more adjustment members, which may increase flexibility.

FIG. 5 gives an overview of the method 200 for mounting components on a substrate according to the invention. The procedure may include:

providing 210 of a bonding head 110 displaceable relative to a substrate 160 along a first 170 and a second 175 movement axis, the second 175 movement axis being substantially perpendicular to the first 170 movement axis;

providing 220 a pick-up member 180 as a receiving element having a contact surface 185, the pick-up member 180 being attached to the bonding head 110, the contact surface 185 being configured and arranged to be releasably attachable or releasable to components 150, and further configured and arranged to be rotatable about the second movement axis 175;

230 Providing a first engagement member 120 attached to bonding head 110;

240 Providing a first adjustment member 130 in a first adjustment position 132 for rigid engagement with the first engagement member 120;

250 Moving the bonding head 110 to the first adjustment position 132;

260 Engaging the first engagement member 120 rigidly with the first adjustment member 130;

270 Moving the bonding head 110 along the first movement axis 170 relative to the first adjustment member 130, wherein the contact surface 185 rotates about the second movement axis 175;

280 Releasing the first engagement member 120 from the first adjustment member 130; and 290 Moving the bonding head 110 to the substrate position 165, wherein the bonding head 110 maintains the rotation of the contact surface 185 about the second movement axis 175.

Figure 6:
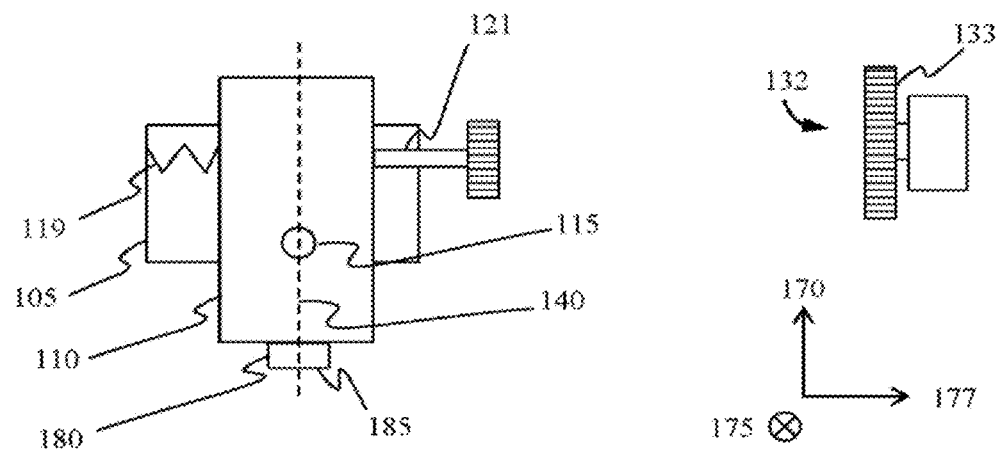
FIG. 6 shows a further embodiment for inclination adjustment with a combination of rack and pinion as engagement and adjustment member.

FIG. 6 shows an alternative tilt adjustment embodiment with a pair of rack and pinion engagement members that may be used with any of the invention's embodiments. The bonding head 110 is arranged to rotate around the second movement axis 175, similar to FIG. 2.

The left view in FIG. 6 schematically shows the bonding head 110 and the pick-up member 180. On the right side the coordinate system is shown—the first movement axis 170 (Z) is shown vertically and the third movement axis 177 (Y) horizontally. In this example, the bonding head 110 is viewed along the second movement axis 175 (X), i.e. the second movement axis 175 (X) goes into the page.

The bonding head 110 is attached to the remaining apparatus 100 by means of a bonding head attachment 105 so that it may be swivelled around the pivot point 115.

The engagement member 121 consists of a pinion arranged at a distal end. Internally, a conventional spindle screw drive (not shown) is attached to the pinion 121 so that rotation of the pinion causes rotation of the spindle screw drive. The spindle screw drive is also attached to the bonding head 110 in such a way that rotation of the spindle screw drive facilitates rotation of the bonding head 110 around the pivot 115 and around the second movement axis. This results in a rotation (tilt) of the contact surface 185 about the second movement axis 175. The tilt adjustment mechanism further consists of an elastic member 119 mounted between the bonding head 110 and the bonding head attachment 105. This provides a corresponding preload so that the bonding head 110 is preloaded against the spindle screw drive—an alternative mechanism for blocking the tilt position. In this example, rotation around the second movement axis 175 is locked.

The adjustment member provided in the first adjustment position 132 is a rack 133 which is configured and arranged to interact with the pinion 121 so that rotation of the pinion 121 is possible. In this example, the rack 133 extends along the first movement axis 170.

Engaging may be done by moving the bonding head 110 to the first adjustment position 132 so that the pinion 121 is aligned at a distal end along the first 170, second 175 and third 177 movement axes so that pinion 121 and rack 133 are close together. A displacement along the second movement axis 175 to the rack 133 ensures a rigid engagement. The subsequent movement along the first movement axis 170 at substantially constant positions along the second movement axis 175 and the third movement axis 177 causes rotation of the pinion 121, resulting in rotation of the spindle screw drive (not shown) and rotation of the bonding head 110 about the pivot 115. A rotation (inclination) of the contact surface 185 around the second axis 175 is therefore also provided.

The available swivel range depends on the engagement position of the pinion 121 in the first movement axes 170. If the reach is insufficient because the pinion reaches the end of the rack 133, the pinion 121 may be disengaged, moved to the other end of the rack 133 and rigidly engaged again.

The rotation (inclination) of the contact surface 185 about the second movement axis 175 is held by the preload of the bonding head 110 against the spindle screw drive by the elastic member 119.

Suitable elastic members 119 may be e.g. springs, rubber belts, rubber bands.

Although in this example the rack 133 extends along the first movement axis 170, it is obvious to the skilled person that the apparatus 100 may be configured to allow rotation of the pinion 121 with a rack 133 extending along the second movement axis 175.

Figure 7:
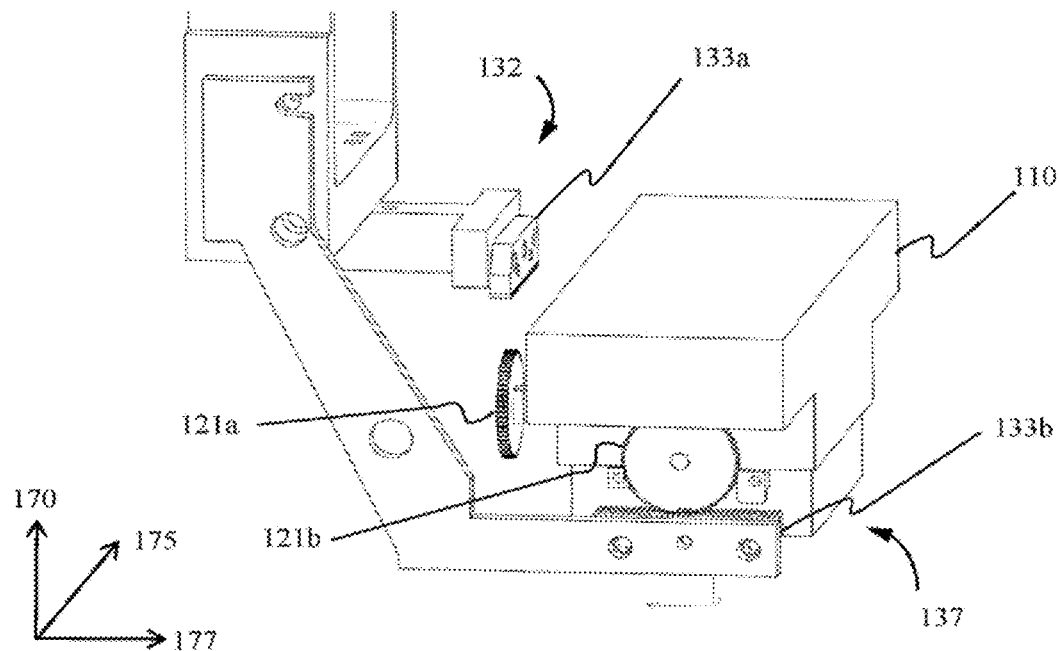
FIG. 7 shows another version of the invention as a combination of rack and pinion as engagement and adjustment member at two adjustment positions.

FIG. 7 shows a further embodiment of the invention. A bonding head 110 is provided which may rotate around the second movement axis 175 and around the third movement axis 177. The tilt adjustment and holding mechanism is the same as shown in FIG. 6.

The bonding head consists of two pinions 121*a*, 121*b*—one 121*a* configured and arranged for rotation about the second movement axis 175 and the other 121*b* for rotation about the third movement axis 177.

The apparatus 100 is configured and arranged to provide two racks 133*a*, 133*b*—one 133*a* at a first adjustment position 132 and the other 133*b* at a second adjustment position 137.

Rigid engagement in the first adjustment position 132 is achieved by moving the bonding head 110 to the first adjustment position 132 so that the pinion at the distal end of the pinion 121*a* is aligned along the first 170, second 175 and third 177 movement axes so that pinion 121*a* and rack 133*a* are close together. A displacement along the first movement axes 170 to the rack 133*a* ensures a rigid engagement. The subsequent movement along the second movement axis 175 at substantially constant positions along the first 170 and third 177 movement axes causes rotation of the pinion 121*a*, resulting in rotation of the spindle screw drive (not shown) and rotation of the bonding head 110 about the second axis 175. Rotation (inclination) of contact surface 185 (not shown) around second axis 175 thus also is provided.

The rigid engagement in the second adjustment position 137 (as depicted) is achieved by moving the bonding head 110 to the second adjustment position 137 so that the pinion is aligned at the distal end of the pinion 121*b* along the first 170, second 175 and third 177 movement axes so that pinion 121*b* and rack 133*b* are close together. A displacement along the first movement axes 170 to the rack 133*b* ensures a rigid engagement. The subsequent movement along the third movement axis 177 at substantially constant positions along the first 170 and second 175 movement axes causes rotation of the pinion 121*b*, resulting in rotation of the spindle screw drive (not shown) and rotation of the bonding head 110 about the third axis 177. Turning (inclination) of contact surface 185 (not shown) around third axis 177 thus also is provided.

The rack 133*a* in the first adjustment position 132 extends along the second movement axis 175. The rack 133*b* in the second adjustment position 137 extends along the third movement axis 177. As mentioned above in relation to FIG. 6, different orientations of each rack 133a, 133b may be used.

In another aspect of the invention, apparatus 100 may be configured and arranged to use a motion along a movement axis to allow rotation (tilt) about the same movement axis:

| Movement along | | Turn around |
|---|---|---|
| of the first movement axis 170 | enables | the first movement axis 170 |
| of the second movement axis 175 | enables | the second movement axis 175 |
| the third movement axis 177 | enables | the third movement axis 177 |

In the configuration shown in FIG. 7, the apparatus 100 is also configured so that the bonding head 110 may be moved between the first 132 and second 137 adjustment positions by movement substantially along the first movement axis 170. Since both rotations must be adjusted to achieve high plane-parallelism between components 150 and the substrate, the time for inclination adjustment may be reduced when the adjustment positions are close together. Limiting the movement to one movement axis may further reduce the time required. A further reduction may also be achieved by ensuring that the disengagement direction of one adjustment position substantially corresponds to the engagement direction of the other adjustment position.

In general, two types of tilt errors may occur—a static tilt due to mechanical and angular tolerances in the apparatus 100, and (in particular) in the bonding head 110, pick-up member 180 and contact surface 185. The other cause of tilt errors are dynamic factors such as thermal expansion and wear of mechanical parts. With conventional apparatus, the inclination will only be checked after one hundred to five hundred substrates of 160 each. The invention offers a relatively inexpensive and relatively fast adjustment option that allows the inclination to be checked and adjusted after each substrate or during operation on a substrate.

In addition, it may be advantageous to provide a measurement and/or monitoring mechanism for one or more of the contact surfaces 185 slopes as this would allow some automatic monitoring.

A high degree of automation may be provided by providing a processor configured and arranged to determine the degree of displacement along the first movement axis 170 to obtain a desired rotation about the second 175 and/or the third movement axis 177; and by further configuring and arranging the processor to stop displacement along the first axis 170 when a desired inclination of the contact surface 185 is reached.

It may also be beneficial to provide an inclination sensor, configured and arranged to measure an inclination of the substrate 160; and to provide a processor (or further configure an existing processor) to determine the degree of displacement along the first axis 170 to obtain a desired rotation about the second 175 and/or the third movement axis 177 using the measured inclination of the substrate. A high degree of accuracy and reliability may be achieved by monitoring the inclination of the substrate 160.

In addition or alternatively, the measurement of one or more forces on the contact surface 185 during operation, in particular the assembly of components 150 on the substrate 160, may provide information about any inclination problems that may occur.

Additionally or alternatively, a temperature of the components 150 and/or the substrate 160 and/or the contact area 185 may be measured and/or monitored. By providing a processor (or further configuration of an existing processor) for determining the degree of displacement along the first axis 170 to achieve a desired rotation about the second 175 and/or the third movement axis 177 using the measured temperatures, a high degree of compensation for the dynamic tilting errors occurring during operation may be achieved.

In summary, it may be said that the invention is aimed at an apparatus and a method for mounting components on a substrate. Processing is often interrupted during operation because the components are not provided for mounting parallel to the substrate. In some cases this may lead to component and substrate fractures. Inclination control solutions increase the cost, weight and complexity of the 110 bonding head.

By tilting the contact surface 185 using existing drives and/or actuators, simplified tilt correction is made possible, providing high throughput and high reliability. The tilt correction mechanism consists of one or more engagement members 120, one or more adjustment member 130 and one or more tilt position blocks 117. In some cases passive elements and mechanisms may be used.

LIST OF REFERENCE NUMERALS

| No. | English name |
|---|---|
| 100 | component mounting apparatus |
| 101 | bonding head support carrier |
| 102 | bonding head mounting |
| 105 | bonding head attachment |
| 106 | further bonding head attachment |
| 110 | bonding head |
| 115 | rotation pivot |
| 116 | further rotation pivot |
| 117 | tilt position block |
| 118 | further tilt position block |
| 119 | elastic member |
| 120 | first engagement member |
| 121 | pinion |
| 122 | further engagement member |
| 125 | second engagement member |
| 130 | first adjustment member |
| 131 | further adjustment member |
| 132 | first adjustment position |
| 133 | rack |
| 135 | second adjustment member |
| 137 | second adjustment position |
| 140 | longitudinal axis of bonder head and/or the pickup member |
| 150 | components |
| 160 | substrate |
| 165 | substrate position |
| 170 | first movement axis (e.g. z) |
| 175 | second movement axis (e.g. x or y) |
| 177 | third movement axis (e.g. y) |
| 180 | pickup member |
| 185 | contact surface |
| 190 | substrate base |
| 200 | method for mounting components on a substrate |
| 203 | retaining the rotation of the contact surface around the second movement axis |
| 205 | retaining the rotation of the contact surface around the third movement axis |
| 207 | providing a tilt sensor |
| 210 | providing a bonding head |
| 215 | configuring and arranging the bonding head |
| 220 | providing a pickup element with a contact surface |
| 225 | configuring and arranging the contact surface |
| 230 | providing a first engagement member |

-continued

| No. | English name |
|---|---|
| 235 | providing a second engagement member |
| 240 | providing a first adjustment member |
| 245 | providing a second adjustment member |
| 250 | displacing the bonding head to the first adjustment position |
| 255 | displacing the bonding head to the second adjustment position |
| 260 | engaging the first engagement member rigidly with the first adjustment member |
| 265 | engaging the second engagement member rigidly with the second adjustment member |
| 270 | displacing the bonding head along the first movement axis |
| 275 | rotating the bonding head around the third movement axis |
| 280 | disengaging the first engagement member |
| 285 | disengaging the second engagement member |
| 290 | displacing the bonding head to the substrate position |

The invention claimed is:

1. A method (200) of adjusting a rotation of a contact surface (185) to at least one rotation angle before mounting components (150) on a substrate (160), provided at a substrate mounting position (165), the method comprising:
providing (210) a bonding head (110) displaceable relative to the substrate (160) along first (170) and second (175) movement axes, the second movement axis (175) being substantially perpendicular to the first movement axis (170);
providing (220) a pick-up member (180) having the contact surface (185), wherein the pick-up member (180) is disposed on the bonding head (110), and wherein the contact surface (185) is configured and arranged to be releasably attachable to components (150), and the contact surface (185) is further configured and arranged to be rotatable about the second movement axis (175);
providing (230) a first engagement member (120), disposed on the bonding head (110), configured and arranged to apply a force along a third movement axis (177) to the bonding head (110) such that the contact surface (185) rotates about the second movement axis (175), the third movement axis (177) being substantially perpendicular to the first movement axis (170) and substantially perpendicular to the second movement axis (175);
providing (240) a first adjustment member (130) in a first adjustment position (132) for rigid engagement with the first engagement member (120);
moving (250) the bonding head (110) to the first adjustment position (132);
rigidly engaging (260) said first engagement member (120) with said first adjustment member (130);
displacing (270) the bonding head (110) along the first movement axis (170), relative to the first adjustment member (130), whereby a force is applied along the third movement axis (177) to rotate the contact surface (185) about the second movement axis (175) to at least one rotation angle;
releasing (280) said first engagement member (120) from said first adjustment member (130); and
displacing (290) the bonding head (110) toward the substrate mounting position (165), the bonding head (110) maintaining (203) the rotation of the contact surface (185) about the second movement axis (175) at the at least one rotation angle.

2. The method according to claim 1, the method further comprising:
configuring and arranging (215) the bonding head (110) to be displaceable relative to the substrate (160) along the third movement axis (177);
configuring and arranging (225) said contact surface (185) so as to be rotatable about said third movement axis (177);
providing (235) a second engagement member (125), disposed on the bonding head (110), configured and arranged to apply a force along the second movement axis (175) to the bonding head (110) such that the contact surface (185) rotates about the third movement axis (177);
providing (245) a second adjustment member (135) in a second adjustment position (137), the second adjustment member (135) being configured and arranged to rigidly engage the second engagement member (125);
moving (255) the bonding head (110) into the second adjustment position (137);
rigidly engaging (265) said second engagement member (125) with said second adjustment member (135);
displacing (270) the bonding head (110) along the first movement axis (170), relative to the second adjustment member (135), whereby a force is applied along the second movement axis (175) to rotate the contact surface (185) about the third movement axis (177) to at least one further rotation angle;
releasing (285) the second engagement member (125) from the second adjustment member (135); and
displacing (290) the bonding head (110) to the substrate mounting position (165), the bonding head (110) maintaining (205) the rotation of the contact surface (185) about the third axis (177) of motion at the at least one further rotation angle.

3. The method according to claim 1, wherein the bonding head (110) is configured and arranged (215) to maintain (203, 205) the rotation of the contact surface (185) at the at least one rotation angle using an elastic member, a spring member, a magnetic member, an electrical member, an electromagnetic member, a vacuum member, a gas-powered member, a friction member, a hydraulic member, an inductive member, or any combination thereof.

4. The method according to claim 1, the method further comprising (200):
providing (207) an inclination measuring device, configured and arranged to measure the at least one rotation angle of the contact surface (185) about the second movement axis (175);
providing a processor, configured and arranged to determine a degree of displacement along the first movement axis (170) to obtain at least one desired rotation angle about the second movement axis (175); and
further configuring and arranging the processor to stop displacement along the first movement axis (170) when the at least one desired rotation angle of the contact surface (185) is reached.

5. The method according to claim 1, the method further comprising (200):
providing an inclination sensor, configured and arranged to measure an inclination of the substrate (160); and
providing a processor, configured and arranged to determine a degree of displacement along the first movement axis (170) to obtain at least one desired rotation angle about the second (175) movement axis using an inclination measured with the inclination sensor.

6. The method according to claim 1, the method further comprising (200):

provide a temperature sensor, configured and arranged to measure a temperature of said bonding head (110), a relative temperature of said bonding head (110), a temperature of said contact surface (185), a relative temperature of said contact surface (185), or any combination thereof; and providing a processor, configured and arranged to determine a degree of displacement along the first movement axis (170) to obtain at least one desired rotation angle about the second (175) movement axis using a temperature measured with the temperature sensor.

7. The method according to claim 1, the method further comprising (200):

providing a temperature sensor, configured and arranged to measure a temperature of the substrate (160), a relative temperature of the substrate (160), a temperature of a substrate base (190) arranged to hold the substrate, a relative temperature of the substrate base (190), or any combination thereof; and providing a processor, configured and arranged to determine a degree of displacement along the first movement axis (170) to obtain at least one desired rotation angle about the second (175) movement axis using a temperature measured with the temperature sensor.

* * * * *